United States Patent [19]
Washabaugh

[11] Patent Number: 5,452,215
[45] Date of Patent: Sep. 19, 1995

[54] SYSTEM AND METHOD FOR DESIGNING A FINITE STATE MACHINE TO REDUCE POWER DISSIPATION

[75] Inventor: Scott T. Washabaugh, Cary, N.C.

[73] Assignee: IBM Business Machines Corporation, Armonk, N.Y.

[21] Appl. No.: 295,198

[22] Filed: Aug. 24, 1994

[51] Int. Cl.$^6$ .......................................... G05B 19/418
[52] U.S. Cl. .................... 364/468; 364/489; 364/490; 364/491
[58] Field of Search ............... 364/188–193, 364/488–491, 468, 578

[56] References Cited

U.S. PATENT DOCUMENTS

| | | | |
|---|---|---|---|
| 4,580,228 | 4/1986 | Noto | 364/491 |
| 5,119,314 | 6/1992 | Hotta et al. | 364/491 |
| 5,140,402 | 8/1992 | Murakata | 364/491 |
| 5,212,653 | 5/1993 | Tanaka | 364/491 |
| 5,225,991 | 7/1993 | Dougherty | 364/491 |
| 5,267,175 | 11/1993 | Hooper | 364/489 |
| 5,283,753 | 2/1994 | Schucker et al. | 364/490 |
| 5,311,079 | 5/1994 | Ditlow et al. | 364/491 |

OTHER PUBLICATIONS

S. Devadas and A. R. Newton, "Exact Algorithms for Output Encoding, State Assignment and Four–Level Boolean Minimization," *IEEE Transactions on Computer–Aided Design Integr. Circuits Syst.*, vol. 10, No. 1, pp. 13–27, Jan. 1991.

G. De Micheli, R. Brayton, and A. L. Sangiovanni–Vincentelli, "Optimal State Assignment for Finite State Machines," *IEEE Transactions on Computer–Aided Design*, vol. CAD–4, No. 3 pp. 269–284, Jul. 1985.

G. De Micheli, "Symbolic Design of Combinational and Sequential Logic Circuits Implemented by Two–level Logic Macros," *IEEE Transactions on Computer–Aided Design*, vol. CAD–5, No. 4, pp. 597–616, Oct. 1986.

R. Amann and U. Baitinger, "Optimal State Chains and State Codes in Finite State Machines," *IEEE Transactions on Computer–Aided Design*, vol. 8, No. 2, Feb. 1989.

S. Yang and M. Ciesielski, "On the Relationship Between Input Encoding and Logic Minimization," 23rd Annual Hawaii International Conference in System Sciences, vol. 1, pp. 377–386, 1990.

S. Devadas, H–K. T. Ma, A. R. Newton, and A. Sangiovanni–Vincentelli, "Mustang: State Assignment of Finite State Machines for Optimal Multi–Level Logic Implementations",: *IEEE Transactions on CAD*, vol. 7, Dec. 1988.

B. Lin and A. R. Newton, "Synthesis of Multiple Level Logic from Symbolic High–Level Description Languages," *VLSI*, 1989.

A. Shen, A. Ghosh, S. Devadas, K. Keutzer, "On Average Power Dissipation and Random Pattern Testability of CMOS Combinational Logic Networks," *Proc. IEEE ICCAD*, pp. 402–407, Nov. 1992.

X. Du, G. Hactel, P. Moceyunas, "MUSE: A Multilevel Symbolic Encoding Algorithm for State Assignment," *Proceedings of the Twenty–Third Annual Hawaii International*–

(List continued on next page.)

*Primary Examiner*—James P. Trammell
*Attorney, Agent, or Firm*—Stephen T. Keohane; Kelly Kordzik

[57] ABSTRACT

Accordingly, a digital logic circuit in the form of a finite state machine (FSM) is implemented in a semiconductor structure such as complementary metal oxide silicon (CMOS) with reduced power dissipation by determining transition probabilities for transitions between states in the FSM, producing a constraint matrix to identify constraints to producing a minimum area implementation consistent with minimum power dissipation, constructing one or more state chains having transitions with highest probability and implementing each of these state chains in order of probability to achieve the implementation of the FSM having minimum power dissipation.

21 Claims, 7 Drawing Sheets

OTHER PUBLICATIONS

*tional Conference on System Sciences,* pp. 367–376, 1990.

K. Roy, S. Prasad, "Circuit Activity Based Logic Synthesis for Low Power Reliable Operations," *IEEE Transactions on Very Large Scale Integration (VLSI) Systems,* vol. 1, No. 4, pp. 503–513, Dec. 1993.

K. Roy, S. Prasad, "SYCLOP: Synthesis of CMOS Logic for Low Power Applications",: *IEEE International Conference on Computer Design,* pp. 464–467, Oct. 1992.

J. Hennessy and D. Patterson. *Computer Architecture, A Quantitative Approach.* San Mateo, Calif.: Morgan Kaufmann Publishers, Inc., 1990.

R. Rudell and A. Sangiovanni-Vincentelli, "Espresso-MV: Algorithms for Multi-valued Logic Minimization," *Proc. Custom Int. Circ. Conf.,* Portland, Oreg., May 1985.

TRANSITION PROBABILITIES, FROM SIMULATION

| | |
|---|---|
| E - A | 100 |
| A - B | 80 |
| B - C | 80 |
| C - D | 80 |
| D - E | 80 |
| H - E | 13 |
| A - F | 10 |
| A - J | 10 |
| F - G | 10 |
| J - K | 10 |
| G - H | 10 |
| K - M | 4 |
| M - E | 4 |
| K - H | 3 |
| K - E | 3 |

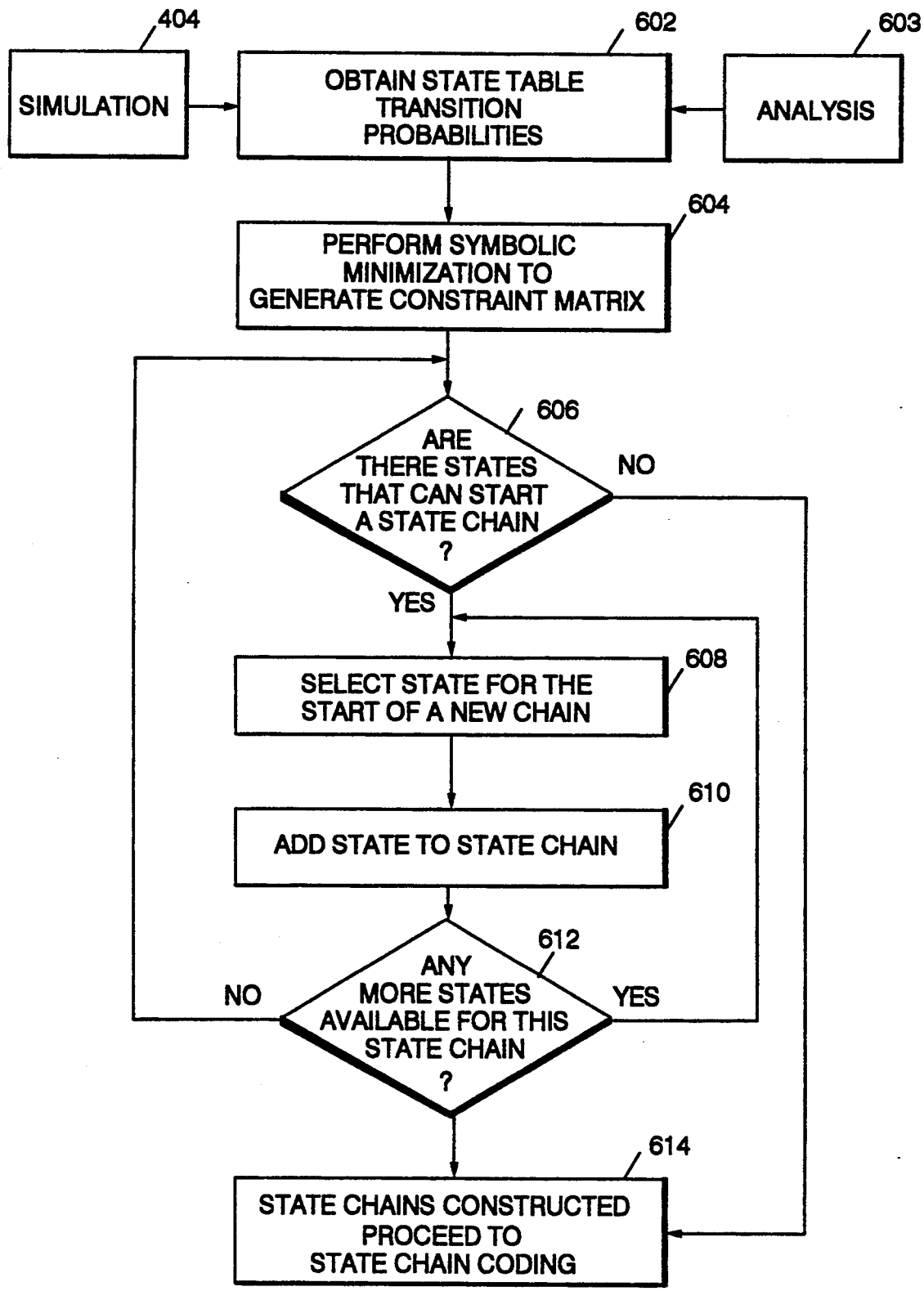

STATE ASSIGNMENT - CODING STATE CHAINS

STATE ASSIGNMENT - CODING REMAINING STATES

SYSTEM AND METHOD FOR DESIGNING A FINITE STATE MACHINE TO REDUCE POWER DISSIPATION

BACKGROUND OF THE INVENTION

1. Field of the Invention

The present invention relates to data processing systems and methods and more particularly to systems and methods for designing data processing systems having reduced power dissipation characteristics.

2. Prior Art

Assigning binary codes to the symbolic state values of a finite state machine (FSM) is a very complex problem. For small machines, algorithms based on Boolean algebra or exact methods may be applied. (See for example, Devadas, et al., "Exact Algorithms for Output Encoding, State Assignment and Four-Level Boolean Minimization," *IEEE Transaction on Computer-Aided Design of Integrated Circuit Systems*, Vol. 10, No. 1, pp 13–27, January 1991.) Various heuristic techniques are required for larger designs. (See for example, De Micheli, et al., "Optimal State Assignment for Finite State Machines," *IEEE Transactions on Computer-Aided Design*, Vol. CAD-4, pp. 269–284, July 1985; De Micheli, "Symbolic Design of Combinational and Sequential Logic Circuits Implemented by Two-level Logic Macros," *IEEE Transactions on Computer-Aided Design*, Vol. CAD-5, pp. 597–616, October 1986; Amann, et al., "Optimal State Chains and State Codes in Finite State Machines," *IEEE Transactions on Computer-Aided Design*, Vol. 8, No. 2, February 1989; Devadas, et al., "Mustang: State Assignment of Finite State Machines for Optimal Multi-level Logic Implementations," *IEEE Transactions on Computer-Aided Design*, Vol. 7, December 1988; and Lin, et al., "Synthesis of Multiple Level Logic from Symbolic High-level Description Languages," VLSI, 1989.) The primary goal of these techniques is to reduce the amount of area required, and it has been shown that careful assignment of state codes can make a significant difference in total area.

As designs become larger, a new concern appears. Even if the design fits on the chip area allocated, if it dissipates too much power, then limitations may be placed on performance or thermal operating environment. Furthermore, for battery powered applications, such as, laptop computers, the additional current drain means a shorter operating time. If the target technology is CMOS, then power dissipation can be controlled by limiting the number of switching transitions in the design, since power dissipation is directly proportional to the number of switching transitions.

Although the above references generally discuss optimizing state assignments in finite state machines for the purpose of reducing chip area, none of the references teach nor suggest a state assignment technique which employs state transition probabilities to reduce power dissipated by the integrated circuit chip.

An article by Roy, et al. entitled "Syclop: Synthesis of CMOS Logic for Low Power Applications," published in the *IEEE Transactions*, 1992, presents a system which synthesizes finite state machines and combinatorial logic for low power applications. The system described in the paper minimizes the area and the transition density at the internal nodes of a CMOS circuit. The minimization is based on assumed input signal probabilities and transition densities. The authors presume a signal probability of 0.5 and a transition density of 0.5 for all cases.

The article relates to multi-level logic and uses assumed signal probabilities and transition densities wherein the system in accordance with the present invention uses measured transition probabilities. Further, the system taught by the article uses simulated annealing whereas the system and method according the present invention uses state chains. Although the system taught by the article is very sensitive to changes in transition probabilities, the system and method according to the present invention was specifically developed with state chains to minimize sensitivity to transition probability changes.

Another article by Roy, et al. entitled "Circuit Activity Based Logic Synthesis for Low Power Reliable Operations," was published in *IEEE Transactions*, December 1993, at pp. 503–513, inclusive. This article recognizes that the average number of transitions at a node is a measure of power dissipation in digital CMOS circuits. The paper addresses the problem of finite state machines and combinational logic synthesis to minimize the average number of transitions at CMOS circuit nodes for battery operated low power operations and increased reliability, while minimizing area at the same time. Logic can be optimally synthesized suited for different applications requiring different types of inputs.

Although the paper refers to circuit simulation and transition density simulation, all examples in the paper employ a presumed signal probability of 0.5 and a transition density of 0.5. The paper does not teach nor suggest a system for designing a finite state machine to achieve minimum power dissipation as is taught and claimed in accordance with the present invention.

A paper by Yang, et al. entitled "On the Relationship Between Input Encoding and Logic Minimization," published at the 23rd Annual Hawaii International Conference on System Sciences, Vol. 1, pp. 377–386, 1990, discusses a theoretical formulation of input encoding based on a concept of compatibility of dichotomies. The paper proposes the extraction of essential prime dichotomies which serve the same purpose of the extraction of essential prime implicants in logic minimization. The paper provides a method which can be applied to the input encoding of combinational logic in the state assignment of finite state machines in both two level and multi-level implementations.

However, the paper does not each a technique for reducing power dissipation in a logic system by reducing switching activity as does the present invention.

A paper by Du, et al. entitled "Muse: A Multi-Level Symbolic Encoding Algorithm for State Assignment," published in the proceedings of the 23rd Annual Hawaii International Conference on System Sciences, pp. 367–376, 1990, presents a state assignment algorithm for encoding of finite state machines targeted for multi-level implementation. The computation of weights of state pairs is based on a multi-level present representation of the one-hot encoded state machine.

The paper does not teach a system and method for reducing power dissipation in a logic system.

SUMMARY OF THE INVENTION

Therefore, it is an object of the present invention to reduce power dissipation in a finite state machine implemented in a semiconductor chip structure by a system and method which employs state transition probabilities and logic minimization techniques to produce a logic circuit having reduced power dissipation.

Accordingly, a digital logic circuit in the form of a finite state machine (FSM) is implemented in a semiconductor structure such as complementary metal oxide silicon (CMOS) with reduced power dissipation by determining transition probabilities for transitions between states in the FSM, producing a constraint matrix to identify constraints to producing an implementation having minimum area with minimum power dissipation, constructing one or more state chains having transitions with highest probability and implementing each of these state chains in order of probability to achieve the implementation of the FSM having minimum power dissipation.

In addition to the usual advantages of increased battery life associated with reducing power dissipation of a logic circuit, longer operating time, lower battery weight, etc., there is also the environmental advantage of reducing the demand for natural resources to construct batteries for these reduced power dissipation circuits and a smaller number of batteries to be discarded thus reducing the solid waste concerns.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWING

For a more complete understanding of the present invention, and the advantages thereof, reference is now made to the following descriptions taken in conjunction with the accompanying drawings, in which:

FIG. 6 including FIGS. 6A, 6B, and 6C is a detailed flow diagram of the state assignment process of FIG. 4 in accordance with the present invention.

DETAILED DESCRIPTION OF A PREFERRED EMBODIMENT OF THE INVENTION

A state assignment technique is presented which uses state transition probabilities to guide in the state encoding process.

Figure 1:
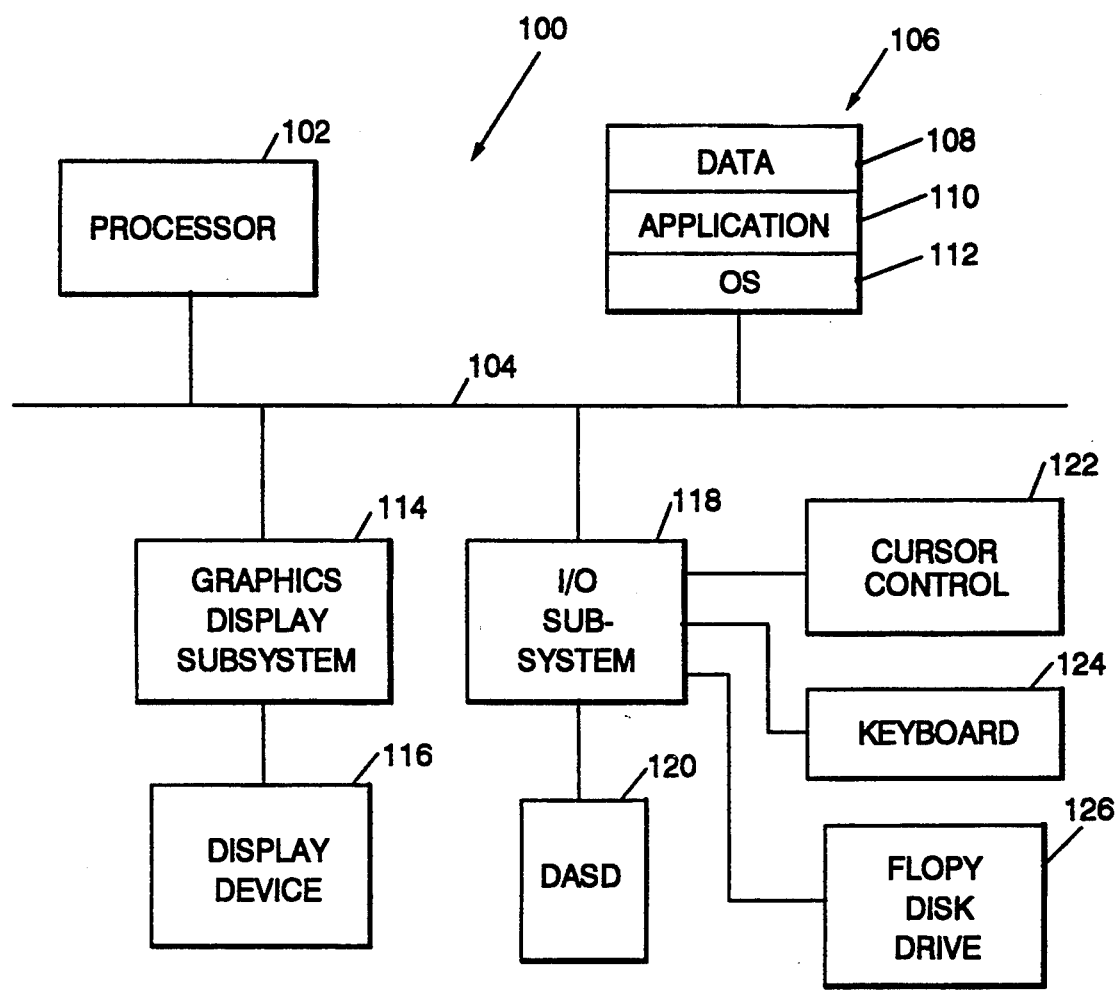
FIG. 1 is a block diagram of a computer system implementing the present invention.

Referring now to FIG. 1, a computer system for implementing the system and method according to the present invention will be described. A processor 102 is connected to a system bus 104 which also has connected thereto a memory 106 having a space for data 108, application programs 110 and operating system 112. A graphics display subsystem 114 is also connected to bus 104 and the graphics display subsystem 114 provides graphics images on display device 116. An input/output subsystem 118 controls dataflow to and from a direct access storage device 120, a cursor control device 122, a keyboard 124 and a floppy disk drive 126. The computer system described with respect to FIG. 1 has components which are well-known in the art and will not be described further herein.

Figure 2:
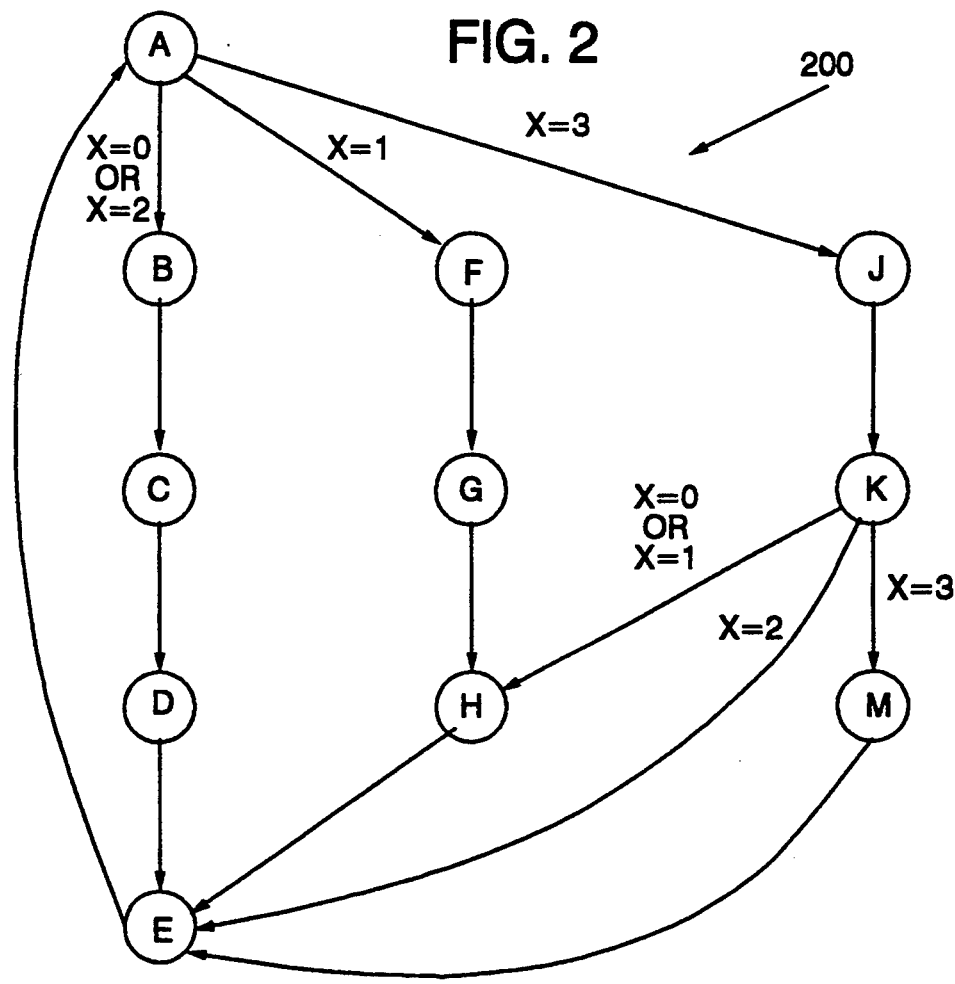
FIG. 2 is a diagram of a finite state machine with transition probabilities in accordance with the present invention.

A finite state machine 200 can be represented in diagram form as shown in FIG. 2. Vertices A-M correspond to states and a directed edge to a transition from one state to another when the proper input occurs. Outputs are functions only of the current state. Other finite state machines may have outputs that are functions of the current state and inputs; these are known as Mealy models.

Figure 3:
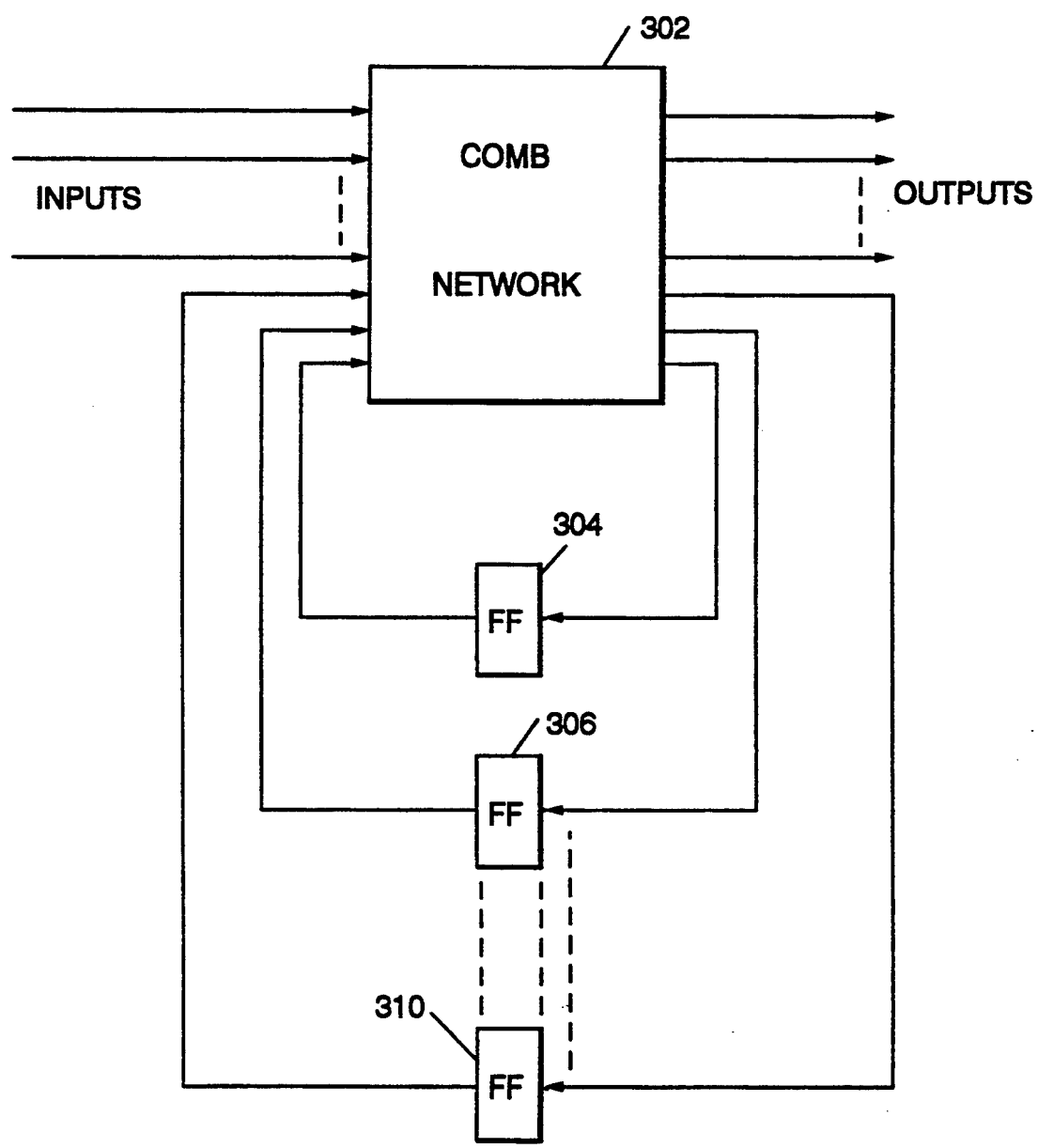
FIG. 3 is a block diagram of a finite state machine in accordance with the present invention separated into combinational and sequential portions.

A finite state machine is implemented by separating the combinational and sequential parts as shown in FIG. 3. The combinational component 302 can be a regular structure such as a Programmable Logic Array or a collection of random logic. A set of flip-flops 304, 306 . . . 310 is used to store the state information.

One form of state coding is known as one-hot coding. One flip-flop such as 304 is assigned for each state in the finite state machine 200. Although this form of coding was used for large FSMs before efficient techniques were developed, it is no longer widely used since the number of flip-flops grows linearly with the number of states.

By using encoding techniques, the minimum number of flip-flops 304–310 to encode the states of a FSM 200 is given by the formula $$N_b = \lceil \log_2 S \rceil \qquad (1)$$

where

S = number of states and $N_b$ = number of flip-flops to encode these states

Several techniques were developed to encode a FSM using the minimum number of state flip-flops. The early ones could encode only small machines. In 1985 De Micheli proposed the KISS technique that allowed encoding of larger machines by using symbolic minimization. Improvements have been made and many other techniques have been developed. Most techniques using symbolic minimization allow more than the minimum number of flip-flops, if the product term count decreases. One important distinguishing characteristic of state assignment techniques is whether they target two-level or multi-level logic. Techniques targeting two level logic networks try to minimize the number of product terms. Multi-level techniques try to predict what the logic synthesis program will do and assign a state encoding which takes advantage of the logic reductions performed during synthesis.

Symbolic minimization is incorporated into many contemporary state assignment techniques. Rather than do many Boolean reductions after various state assignments are tried, one symbolic minimization is done first. The result of symbolic minimization is a constraint matrix, which specifies constraints on the state encodings if the least number of product terms is desired. In general, it is not possible to meet all constraints with the least number of state flip-flops. Either the number of state flip-flops is increased, or the constraints are eliminated one by one until a set of state encodings is obtained which meet all remaining constraints.

Whatever the technique, reduction of the total silicon area required for the finite state machine is the usual goal of these prior art techniques.

A good predictor of power consumption in CMOS devices is given by the following equation:

$$P = C V^2 f \qquad (2)$$

where C=load capacitance, V=supply voltage and f=switching frequency.

The present invention reduces the switching frequency inside FSM 100. The main sources of switching are:

1. State Flip-flops and Clock Drivers. This source of switching activity is minimized by always encoding states with the fewest number of state flip-flops as given in Equation (1).
2. Output Mapping Logic. The output coding is predefined, but the state encoding can have a small effect on the number of transitions.
3. State Transition Logic. This logic determines how many state flip-flops will change and is directly controlled by the state assignment technique. A state assignment where only one state bit changes (Gray code) is optimal, but this can seldom be obtained in any large practical finite state machine. The question then becomes which state transitions should have multiple changes.

Not all state transition probabilities are equal, and priority is given to minimizing multiple changes for transitions with the highest probability. Obtaining these probabilities is discussed in the next section. Additionally, the implementation area should not be allowed to grow significantly. This can be done by minimizing the following cost function A for switching activity while maximizing the number of coding constraints for reduced area.

$$A = \sum_{i=0}^{L-1} \sum_{j=1}^{L} D_{ij} F_{ij} \qquad (3)$$

where $D_{ij}$ = Number of bits different between encodings for state i and state j $F_{ij}$ = Probability of transition from state i to state j Similar cost functions are used for other state assignment programs. Rather than use a matrix F giving transition probabilities between states, several prior art technique use a weight matrix that is related to a logic savings when implemented in a multi-level logic network. Each technique sets up the weight matrix differently and solves the resulting cost function differently.

Satisfying the dual goal of minimizing the switching activity cost function and maximizing the number of satisfied coding constraints complicates the situation.

A state table lists the next state and outputs for any next state and input combination. Current state assignment techniques require only a state table and optionally some information about the synthesis steps that follow state assignment. To satisfy the goal of least switching activity, the system and method according to the present invention requires one very significant additional set of input data. The probability of every transition in the state table must be known. For most machines, there are real differences in these probabilities. High probability paths correspond to normal operating conditions and low probability paths correspond to infrequent operations, exceptions, or error handling sequences. The present invention will give more weight to minimizing transitions for the higher probability paths.

Figure 4:
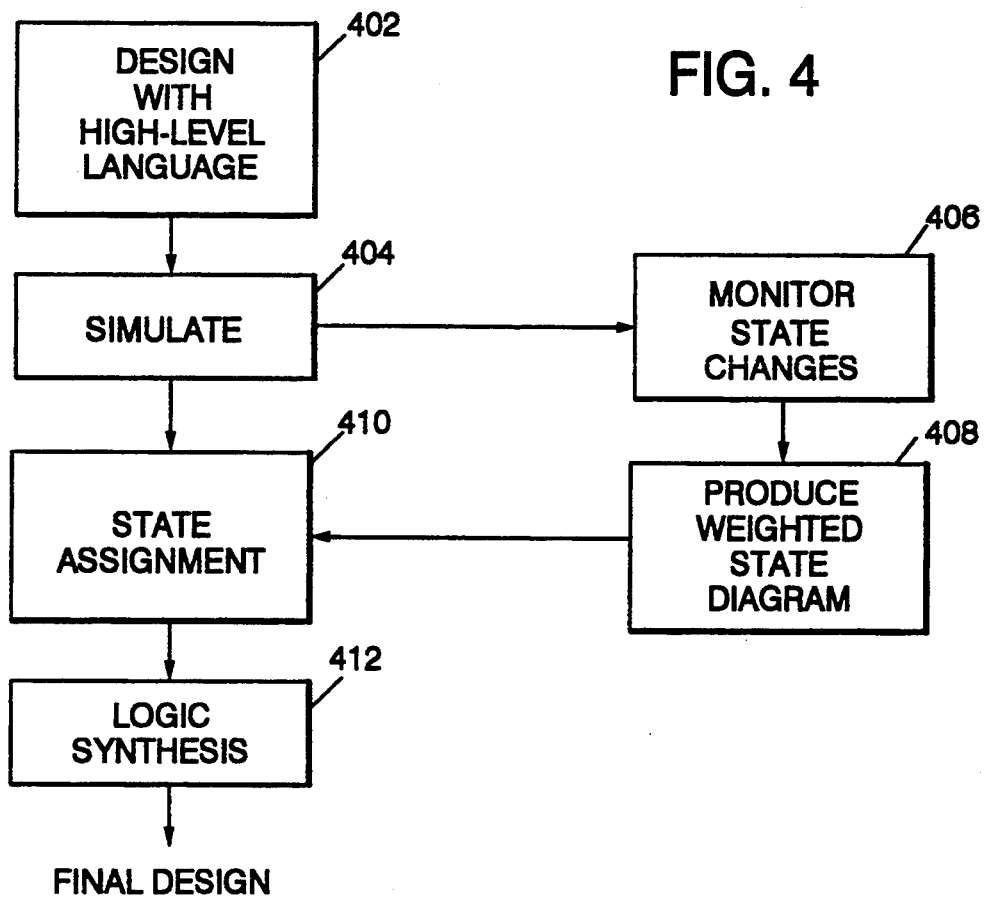
FIG. 4 is a flow diagram of the method in accordance with the present invention.

FIG. 4 shows the design flow employing the system and method of the present invention. After the design is described with a high-level design language 402 and a state table produced, it is simulated 404 to verify correct design. For those simulation test cases or vectors that represent situations where power consumption is important, each state transition is recorded 406. At the end of the verification process each transition in the state diagram will have a probability associated with it and a weighted state diagram is produced 408. Although the exact method of collecting the state transition data depends on the simulator, most simulators can provide this information. Once the transition information has been obtained, state assignment 410 begins. There are two goals that must be considered simultaneously. The cost function given by Equation (3) is minimized to reduce switching activity and a maximum number of symbolic coding constraints must be satisfied to reduce area.

The states involved in the most frequent state transitions are coded first, and fortunately at the beginning of coding it is generally easy to meet the symbolic coding constraints. The major steps of the method are:

Step 1.

The state table transition probabilities can be obtained by simulation or by analysis. If desired, transitions with very low probabilities can be considered to have zero probability, which enables a more efficient coding with respect to area.

Step 2.

Symbolic minimization is done. This step will produce a constraint matrix. Satisfying all constraints produces the smallest two-level logic implementation.

Step 3.

Figure 5:
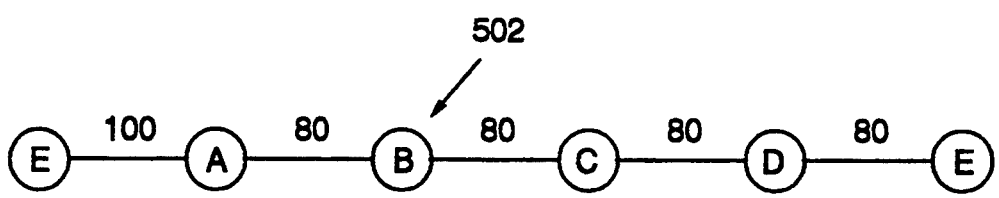
FIG. 5 is a schematic diagram showing state chains for the finite state machine if FIG. 2.
Figure 5:
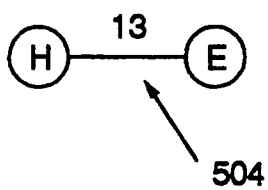

State chains giving the most probable series of state transitions are constructed. Starting with the highest probability transition, add states to the chain that are adjacent to one of the end states of the chain. Continue until there are no new states or until the largest remaining transition is to a state already in the chain. For the second case, include the state in the chain. FIG. 5 shows an example of the state chains 502, 504 for the FSM 200 in FIG. 2. For this example, only transitions with weights greater than 10 were used when forming these chains.

Already coded states, if possible, are used as the head and tail of the chain to minimize the number of state bit changes between chains. This is a significant difference between other techniques that also use state chains to guide the encoding process.

Step 4.

The state chains are coded in the order that they were created, the most probable ones first. If the first state of the chain is not coded, then a code is selected.

The remaining states are coded using a branch and bound method to minimize the number of state bit changes between codes. A lower bound on the least number of state bit changes is calculated based on the length of the chain and the Hamming distance between the first and last states of the chain, if both are coded. Once the lower bound is determined, each successive state in the chain is assigned an unused code that has the smallest Hamming distance from the previous code and does not violate any coding constraints. This process continues until all states in the chain are coded. If a solution is obtained and it is equal to the lower bound, then it must be one of the best possible codings for this chain and the coding terminates. If not, the result of the best solution to date is stored and a backtracking process is started which will try other codes. A branch of the search tree that has more state bit changes than the best solution so far is abandoned. Eventually, either a solution that meets the lower bound will be found, or else the best available solution will be identified.

It is possible that there is no coding for a state chain that does not meet all coding constraints given by symbolic minimization.

When a complete chain has been coded, the codings for the states in the chain will not be undone. Eventually all chains will be coded. Since the chains correspond to frequently used states in the finite state machine, there may be states remaining after chain coding that correspond to infrequently used states. These states are sorted in order of the number of coding constraints in which they appear. Then another branch and bound search is done to find the optimal assignments satisfying only the maximum number of coding constraints. As before, coding constraints are eliminated one by one as required until a coding is possible.

After the state assignment has been completed, logic synthesis 412 may be performed using well-known techniques which are not critical to the present invention.

A RISC processor controller is used as a platform for the system and method of the present invention.

The version of RISC processor used as a test case has 55 states, and is a moderate size Finite State Machine that is too large for exact state assignment methods. Default parameters were used for state assignment and synthesis. First, the finite state machine was described with the Logic Ill description language. Then one state assignment was done, a symbolic state assignment technique. Another state assignment was done, using transition probabilities calculated from instruction frequencies. A third state assignment was done not using any transition probabilities.

Figure 6B:
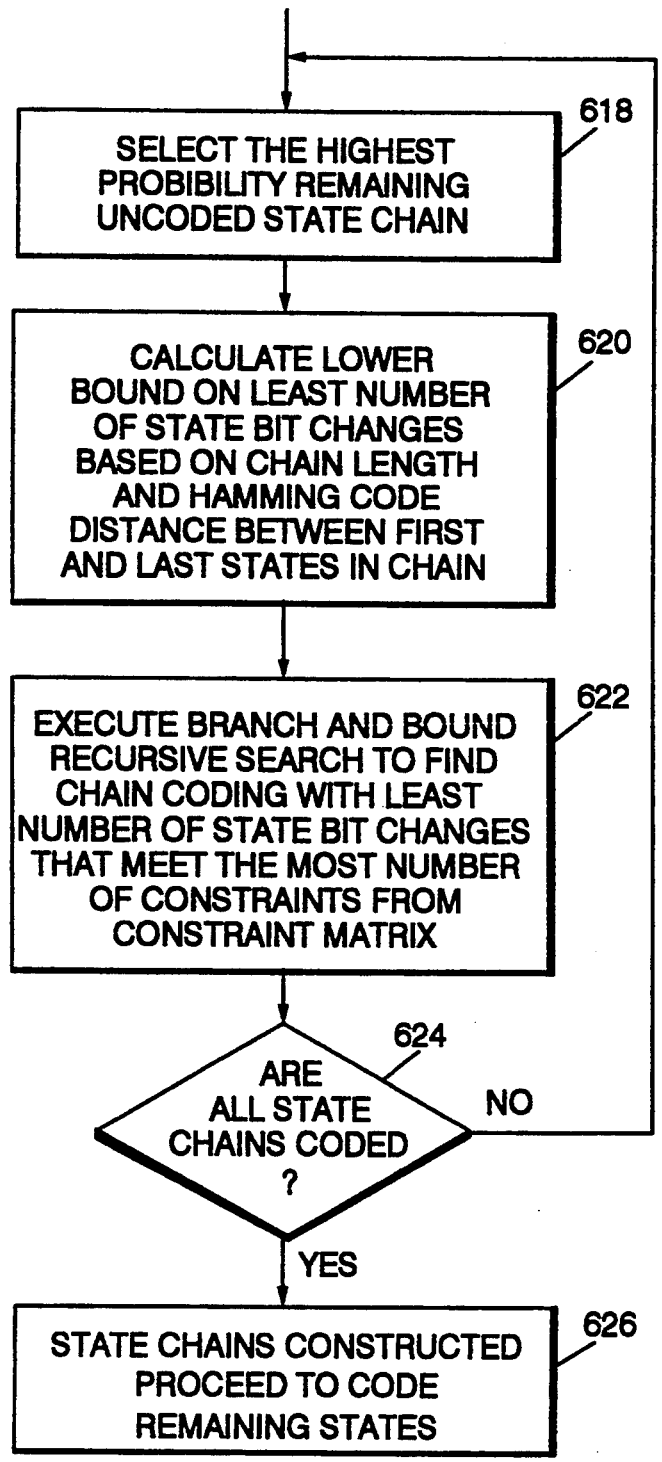
Figure 6C:
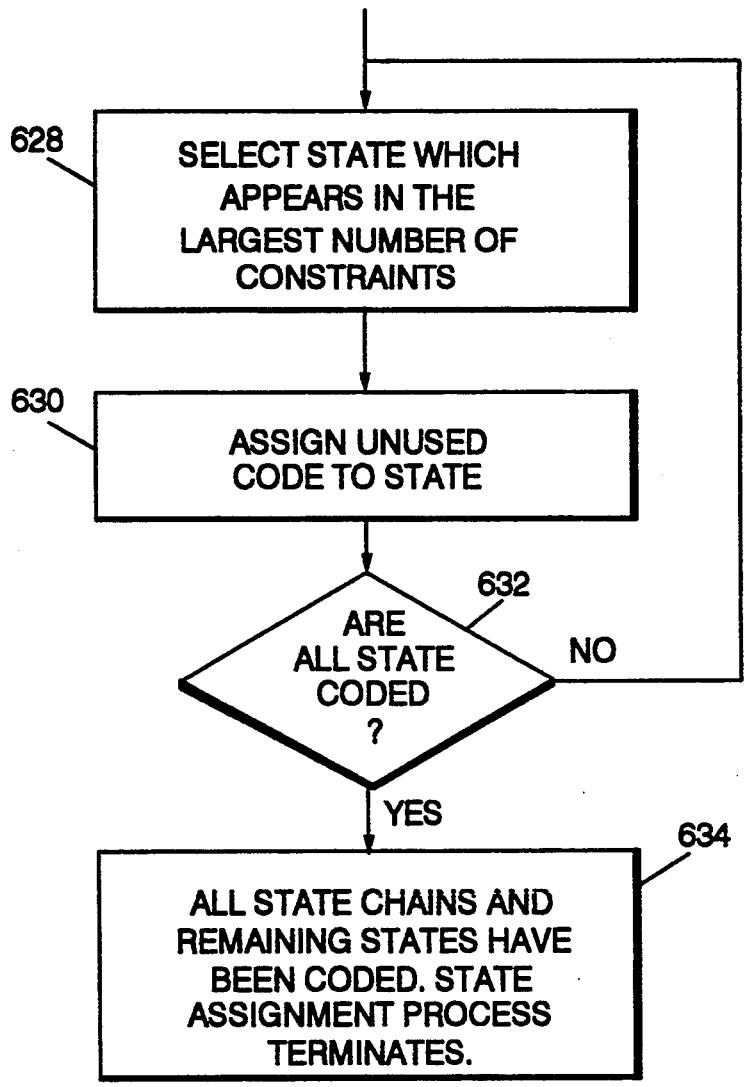

The state assignment step 410 of the method shown with respect to FIG. 4 will now be described in greater detail with reference to FIGS. 6A, 6B and 6C.

State table transition probabilities must be developed for step 602 either from simulation of step 404 (see FIG. 4) or by analysis in step 603 of the high level design developed in step 402 (see FIG. 4).

A threshold may be established such that transitions having weighted probabilities below a predetermined value may be considered to have zero probability thus improving the efficiency of the coding. For example, any weighted probability below 10 should be considered to be zero. Symbolic minimization is performed at step 604 to create a constraint matrix. Satisfying the constraints in the constraint matrix produces the smallest two level logic implementation. A state transition having a highest probability may be used to define a starting point for a state chain (606). For example, in FIG. 5, state chain 502 shows transitions E-A-B-C-D-E all of which have probabilities of at least 80. By contrast, the state transition H-E has a probability of 13. Therefore, the E-A-B-C-D-E state chain has a higher series of state transition probabilities. Since the transition E-A has the highest probability, state E is selected as the starting point for the new chain (608). Since there is always a transition from state E to state A, the next state after state E is state A and state A is added to the state chain (610). From state A, the most probable transition is A-B having a weighted probability of 80, as compared to A-F or A-J having a weighted probability of 10 each. Additional states B, C, D, and E are available for state chain 502 as seen from FIGS. 2 and 5 (612). After each new state is added to the chain, the process loops from step 612 to step 608 and continues until all states for the current state chain have been encountered at which time the process returns to the input of block 606 to determine if there are states that can start a new state chain and if so, steps 608, 610, 612 are repeated for the new chain, or if there are no steps that can start a new step chain, the process indicates that state chains have all been constructed (step 614) and proceeds to state chain coding.

State chains are coded in the order in which they were created thus the highest probability state chains are coded before lower probability state chains (step 618).

A branch and bound method is used to minimize the number of state bit changes between codes. A lower bound on the least number of state bit changes is calculated based on the length of the chain and the hamming code distance between the first and last states of the chain (step 620).

Next, in step 622, the branch inbound recursor search is executed to find a chain coding with the least number of state bit changes that meet the most number of constraints from the constraint matrix generated in step 604. If all state chains have not been coded (step 624), the process loops to the beginning of step 618 for the next most probable encoded state chain to be coded and steps 618, 620, 622 and 624 are repeated for each additional chain in descending order of probability. After all state chains have been constructed, the process proceeds to coding remaining states (step 626).

After all state chains have been coded, there may be states remaining which correspond to infrequently used states. These states are sorted in the order of the number of coding constraints in which they appear (step 628). A branch and bound search is done to find the optimal assignment satisfying only the maximum number of coding constraints with coding constraints being eliminated one by one as required until a coding is possible. A used code is assigned to the state by step 630 and a test is made in step 632 to determine if all states have been coded. If not, the process loops to the beginning of step 628 and then steps 628, 630, and 632 are repeated until all states have been coded, at which time the process terminates at step 634.

Although the present invention and its advantages have been described in detail, it should be understood that various changes, substitutions and alterations can be made herein without departing from the spirit and scope of the invention as defined by the appended claims.

What is claimed is:

1. A system for designing a finite state machine to achieve minimum power dissipation, comprising:
    means for determining one or more state table transition probabilities for transitions between states of said finite state machine;
    means for producing a constraint matrix to identify constraints to producing a minimum area design;
    means for constructing one or more state chains having state table transitions with highest probability; and
    means for implementing design of each of said state chains in the order of probability to produce a minimum power dissipation finite state machine.

2. A system for designing a finite state machine to achieve minimum power dissipation, according to claim 1, further comprising:

means for assigning a predetermined probability value to one or more transitions having a probability value less than a first threshold value.

3. A system for designing a finite state machine to achieve minimum power dissipation, according to claim 2, wherein said predetermined probability value is zero to enable a more efficient design of said finite state machine.

4. A system for designing a finite state machine to achieve minimum power dissipation, according to claim 1, wherein said means for producing a constraint matrix further comprises:
means for symbolic minimization of a logic design.

5. A system for designing a finite state machine to achieve minimum power dissipation, according to claim 1, wherein said means for constructing one or more state chains further comprises:
means for connecting states having a transition probability greater than a second threshold value to an end of one of said state chains.

6. A method implemented in a computer system for designing a finite state machine to achieve minimum power dissipation, comprising the steps of:
determining one or more state table transition probabilities for transitions between states of said finite state machine by simulating a high level language version of said finite state machine in a processor of said computer system;
producing a constraint matrix to identify constraints to producing a minimum power dissipation design;
constructing one or more state chains having state table transitions with highest probability;
implementing design of each of said constructed state chains in the order of probability, wherein said step of implementing includes coding said state chains; and
performing logic synthesis of said finite state machine based on said design.

7. A method for designing a finite state machine to achieve minimum power dissipation, according to claim 6, further comprising the steps of:
assigning a predetermined probability value to one or more transitions having a probability value less than a first threshold value.

8. A method for designing a finite state machine to achieve minimum power dissipation, according to claim 7, wherein said predetermined probability value is zero to enable a more efficient design of said finite state machine.

9. A method for designing a finite state machine to achieve minimum power dissipation, according to claim 6, wherein said step of producing a constraint matrix further comprises:
minimizing a logic design to reduce area of said finite state machine.

10. A method for designing a finite state machine to achieve minimum power dissipation, according to claim 6, wherein said step of constructing one or more state chains further comprises:
connecting states having a transition probability greater than a second threshold value to an end of one of said state chains.

11. A finite state machine with reduced power dissipation, manufactured in accordance with the method of claim 6.

12. A system for minimizing power dissipation in a digital logic system, comprising:
means for determining one or more state table transition probabilities for transitions between states of said digital logic system;
means for producing a constraint matrix to identify constraints to minimizing area of said finite state machine;
means for simulating one or more logic circuits having state table transitions with highest probability; and
means for implementing each of said logic circuits in the order of probability.

13. A system for minimizing power dissipation in a digital logic system, according to claim 12, further comprising:
means for assigning a predetermined probability value to one or more transitions having a probability value less than a first threshold value.

14. A system for minimizing power dissipation in a digital logic system, according to claim 13, wherein said predetermined probability value is zero to enable a more efficient design of said digital logic system.

15. A system for minimizing power dissipation in a digital logic system, according to claim 12, wherein said means for producing a constraint matrix further comprises:
means for symbolic minimization of a logic design.

16. A system for minimizing power dissipation in a digital logic system, according to claim 12, wherein said means for producing a constraint matrix further comprises:
means for connecting states having a transition probability greater than a second threshold value to an end of one of said state chains.

17. A method implemented in a computer system for minimizing power dissipation in a digital logic system, comprising the steps of:
determining one or more state table transition probabilities for transitions between states of said digital logic system;
producing a constraint matrix to identify constraints to producing a minimum power dissipation design;
constructing one or more logic circuits having state table transitions with highest probability as determined in said determining step; and
implementing design of each of said logic circuits in the order of probability, as determined in said determining step.

18. A method for minimizing power dissipation in a digital logic system, according to claim 17, further comprising the steps of:
assigning a predetermined probability value to one or more transitions having a probability value less than a first threshold value.

19. A method for minimizing power dissipation in a digital logic system, according to claim 18, wherein said predetermined probability value is zero to enable a more efficient design of said digital logic system.

20. A method for minimizing power dissipation in a digital logic system, according to claim 17, wherein said step of producing a constraint matrix further comprises:
minimizing a logic design.

21. A method for minimizing power dissipation in a digital logic system, according to claim 17, wherein said step of constructing one or more logic circuits further comprises:
connecting circuits having a transition probability greater than a second threshold value to an end of one of said logic circuits.

* * * * *